United States Patent
Yang et al.

(10) Patent No.: US 9,196,835 B2
(45) Date of Patent: Nov. 24, 2015

(54) POLYMER, METHOD OF MANUFACTURE THEREOF, AND ORGANIC LIGHT-EMITTING DEVICE INCLUDING THE POLYMER

(75) Inventors: Hye-yeon Yang, Seoul (KR); Ho-suk Kang, Seoul (KR); Jhun-mo Son, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 360 days.

(21) Appl. No.: 13/244,153

(22) Filed: Sep. 23, 2011

(65) Prior Publication Data
US 2012/0146005 A1 Jun. 14, 2012

(30) Foreign Application Priority Data
Dec. 13, 2010 (KR) ........................ 10-2010-0127095

(51) Int. Cl.
*H01L 51/50* (2006.01)
*H01L 51/00* (2006.01)
*C08G 73/06* (2006.01)

(52) U.S. Cl.
CPC ........ *H01L 51/0039* (2013.01); *C08G 73/0644* (2013.01); *H01L 51/0043* (2013.01); *C08G 2261/312* (2013.01); *C08G 2261/3142* (2013.01); *C08G 2261/3221* (2013.01); *C08G 2261/412* (2013.01); *C08G 2261/5242* (2013.01); *H01L 51/5016* (2013.01)

(58) Field of Classification Search
USPC ............. 428/690, 917; 313/504, 505; 257/40, 257/E51.05, E51.026, E51.032; 546/81, 546/101, 18, 79
See application file for complete search history.

(56) References Cited

U.S. PATENT DOCUMENTS

| 3,814,719 | A | 6/1974 | Seltzer et al. | |
|---|---|---|---|---|
| 2003/0137239 | A1* | 7/2003 | Matsuura et al. | 313/503 |
| 2003/0170490 | A1* | 9/2003 | Hu et al. | 428/690 |
| 2004/0170863 | A1* | 9/2004 | Kim et al. | 428/690 |
| 2006/0246315 | A1 | 11/2006 | Begley et al. | |

FOREIGN PATENT DOCUMENTS

| JP | 2004185967 A | 7/2004 |
|---|---|---|
| JP | 2004-288379 A | 10/2004 |
| JP | 2006156445 A | 6/2006 |
| JP | 2009-184987 A | 8/2009 |

(Continued)

OTHER PUBLICATIONS

Cao et al. Synthesis and Electroluminescent Properties of Soluble Poly(3,6-fluorene) and Its Copolymer, 2007, Organic Letters, vol. 9, No. 21, pp. 4371-4373.*

*Primary Examiner* — Gregory Clark
(74) *Attorney, Agent, or Firm* — Cantor Colburn LLP

(57) ABSTRACT

A polymer including a first repeating unit represented by Formula 1:

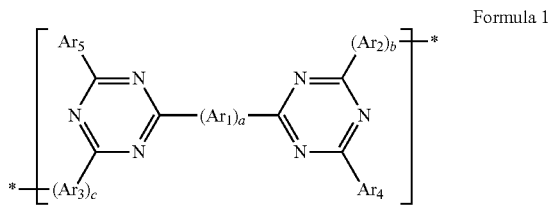

and an organic light-emitting device including the polymer.

9 Claims, 4 Drawing Sheets

(56) References Cited

FOREIGN PATENT DOCUMENTS

| | | |
|---|---|---|
| JP | 2010013421 A | 1/2010 |
| JP | 2010031246 A | 2/2010 |
| KR | 1020070091291 A | 9/2007 |
| WO | 2005053055 A1 | 6/2005 |
| WO | 2008056746 A1 | 5/2008 |
| WO | 2009104708 A1 | 8/2009 |
| WO | 2009148015 A1 | 10/2009 |
| WO | 2010015306 A1 | 2/2010 |
| WO | 2010054730 A1 | 5/2010 |
| WO | 2010084977 A1 | 7/2010 |

\* cited by examiner

POLYMER, METHOD OF MANUFACTURE THEREOF, AND ORGANIC LIGHT-EMITTING DEVICE INCLUDING THE POLYMER

CROSS-REFERENCE TO RELATED APPLICATIONS

This application claims priority to Korean Patent Application No. 10-2010-0127095, filed on Dec. 13, 2010, and all the benefits accruing therefrom under 35 U.S.C. §119, the content of which in its entirety is herein incorporated by reference.

BACKGROUND

1. Field

The present disclosure relates to a polymer, methods of manufacture thereof, an organic light-emitting device including the polymer, and methods of manufacture thereof.

2. Description of the Related Art

Organic light-emitting devices are active emission-type devices, and are lightweight, can be fabricated to have a small number of components, have a simple manufacturing process, provide high image quality, a wide viewing angle, high color purity and moving pictures, and operate with low power consumption at low voltage. Due to such characteristics, they are suitable for various electronic applications.

The organic light-emitting device includes an anode disposed on a substrate, an organic layer including a hole transport layer, an emitting layer, and an electron transport layer disposed on the anode, and a cathode disposed on the organic layer.

If a current is applied to the anode and the cathode, holes injected from the anode move to the emitting layer through the hole transport layer, and electrons injected from the cathode move to the emitting layer through the electron transport layer. The holes and electrons recombine with each other in the emitting layer to generate excitons. Then, the excitons decay radiatively, thereby emitting light having a wavelength corresponding to a band gap of a corresponding material.

Materials for use in the organic layer may be classified as a material suitable for vacuum deposition and a material suitable for solution coating, according to a method of forming the organic layer. The material suitable for solution coating may be mixed with a solvent to provide a composition suitable for coating on a substrate, and the composition may be disposed on a substrate by a known solution-coating method, such as inkjet printing, screen-printing, or spin coating. Nonetheless, there remains a need for improved materials suitable for the organic layer, including materials suitable for solution coating to provide the organic layer.

SUMMARY

Provided is a polymer having a novel structure.

Provided are organic light-emitting devices including the polymers.

Additional aspects will be set forth in part in the description which follows and, in part, will be apparent from the description.

According to an aspect, disclosed is a polymer including a first repeating unit represented by Formula 1:

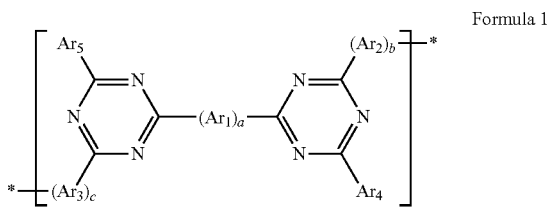

Formula 1 wherein in Formula 1, $Ar_1$ to $Ar_3$ are each independently a substituted or unsubstituted $C_6$-$C_{30}$ arylene group;

a is an integer of 0 to 10;

b and c are each independently an integer of 1 to 10;

$Ar_4$ and $Ar_5$ are each independently hydrogen, deuterium, a halogen, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —N($Q_1$)($Q_2$), or —Si($Q_3$)($Q_4$)($Q_5$); and $Q_1$ to $Q_5$ are each independently hydrogen, deuterium, a halogen, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_2$-$C_{60}$ heteroaryl group.

The polymer may further include a second repeating unit represented by Formula 3 below:

$$*\!-\!\!\left[\!(Ar_6)_e\!\right]\!\!-\!*$$

Formula 3 wherein in Formula 3, $Ar_6$ is a substituted or unsubstituted $C_6$-$C_{30}$ arylene group; and e is an integer of 1 to 10.

According to another aspect, an organic light-emitting device includes: a substrate; a first electrode on the substrate; a second electrode on the first electrode; and a first layer which is disposed between the first electrode and the second electrode and includes the polymer as described above.

Also disclosed is a method of manufacturing an organic light-emitting device, the method including: providing a substrate having a first electrode on the substrate; disposing a first layer on the first electrode; and disposing a second electrode on the first layer, wherein the first layer includes a polymer, the polymer including a first repeating unit represented by Formula 1:

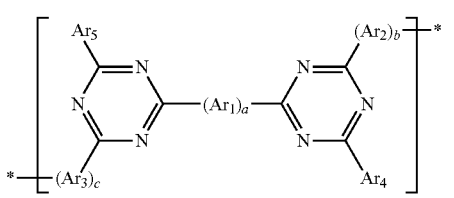

Formula 1 wherein in Formula 1, $Ar_1$ to $Ar_3$ are each independently a substituted or unsubstituted $C_6$-$C_{30}$ arylene group; a is an integer of 0 to 10; b and c are each independently an integer of 1 to 10; $Ar_4$ and $Ar_5$ are each independently hydrogen, deuterium, a halogen, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —$N(Q_1)(Q_2)$, or —$Si(Q_3)(Q_4)(Q_5)$; and $Q_1$ to $Q_5$ are each independently hydrogen, deuterium, a halogen, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_2$-$C_{60}$ heteroaryl group.

BRIEF DESCRIPTION OF THE DRAWINGS

The above and other aspects, advantages and features of this disclosure will become more apparent by describing in further detail embodiments thereof with reference to the accompanying drawings, in which.

DETAILED DESCRIPTION

Figure 1:
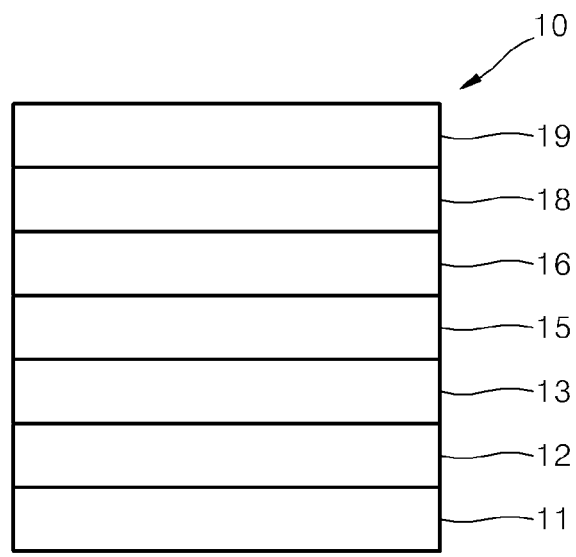
FIG. 1 is a schematic sectional view of an embodiment of an organic light-emitting device.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms "first," "second," "third" etc. may be used herein to describe various elements, components, regions, layers, and/or sections, these elements, components, regions, layers, and/or sections should not be limited by these terms. These terms are only used to distinguish one element, component, region, layer, or section from another element, component, region, layer or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

According to an aspect, a polymer comprising a first repeating unit represented by Formula 1 below is provided:

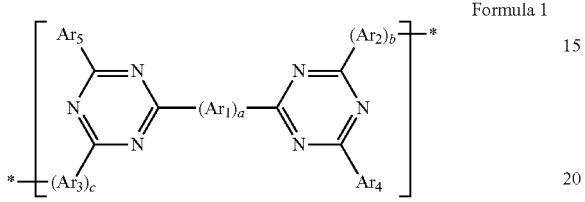

Formula 1 wherein in Formula 1, $Ar_1$ to $Ar_3$ may each be independently a substituted or unsubstituted $C_6$-$C_{30}$ arylene group.

For example, $Ar_1$ to $Ar_3$ may each be independently a substituted or unsubstituted phenylene group, a substituted or unsubstituted pentalenylene group, a substituted or unsubstituted biphenylenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, or a substituted or unsubstituted hexacenylene group, but are not limited thereto.

According to an embodiment, $Ar_1$ to $Ar_3$ may each be independently a substituted or unsubstituted phenylene group, a substituted or unsubstituted naphthylene group, a substituted or unsubstituted anthrylene group, a substituted or unsubstituted fluorenylene group, or a substituted or unsubstituted phenanthrenylene group.

For example, $Ar_1$ to $Ar_3$ may each be independently a group represented by Formulas 2A through 2J:

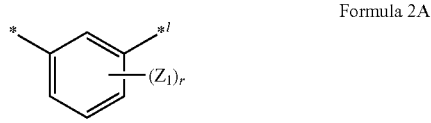

Formula 2A

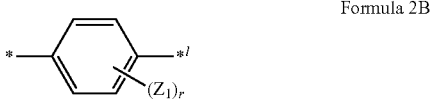

Formula 2B

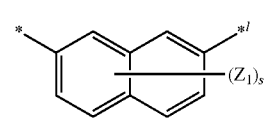

Formula 2C

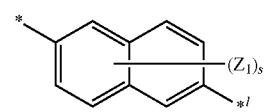

Formula 2D

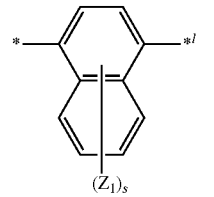

Formula 2E

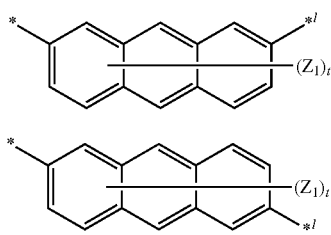

Formula 2F

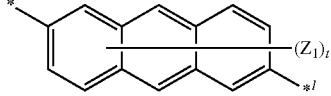

Formula 2G

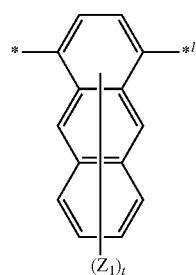

Formula 2H

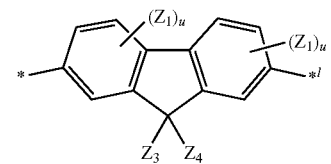

Formula 2I

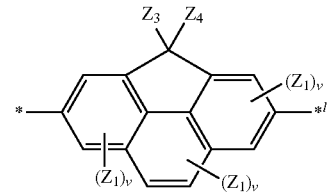

Formula 2J wherein in Formulas 2A through 2J, $Z_1$ to $Z_4$ may each be independently hydrogen, deuterium, a halogen, a hydroxyl group, a cyano group, a substituted or unsubstituted $C_1$-$C_{10}$ alkyl group, a substituted or unsubstituted $C_1$-$C_{10}$ alkoxy group, a substituted or unsubstituted $C_6$-$C_{20}$ aryl group, or a substituted or unsubstituted $C_2$-$C_{20}$ heteroaryl group; r is an integer of 1 to 4; s is an integer of 1 to 6; t is an integer of 1 to 8; u is an integer of 1 to 3; and v is 1 or 2.

For example, $Z_1$ to $Z_4$ may each be independently hydrogen, deuterium, a halogen, a hydroxyl group, a cyano group, a $C_1$-$C_{10}$ alkyl group, or a $C_1$-$C_{10}$ alkoxy group, but are not limited thereto.

In Formula 1, $Ar_4$ and $Ar_5$ may each be independently hydrogen, deuterium, a halogen, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —$N(Q_1)(Q_2)$, or —$Si(Q_3)(Q_4)(Q_5)$.

In Formula 1, a is an integer of 0 to 10, and b and c may each be independently an integer of 1 to 10. For example, a may be 0, 1, 2, 3, or 4. For example, b and c may each be independently 1, 2, 3, or 4.

If a is equal to or greater than 2, the $Ar_1$ units may be identical to or different from each other, if b is equal to or greater than 2, the $Ar_3$ units may be identical to or different from each other, and if c is equal to or greater than 2, the $Ar_3$ units may be identical to or different from each other.

According to an embodiment, the first repeating unit may be represented by Formula 1A below, but is not limited thereto:

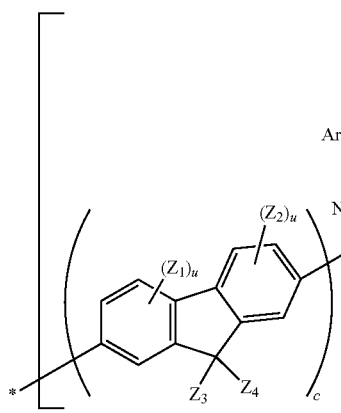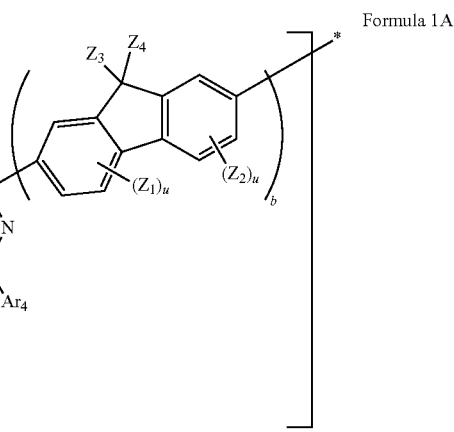

Formula 1A wherein in Formula 1A, a, b, c, $Ar_4$, $Ar_5$, and $Z_1$ to $Z_4$ are as already described above with reference to Formula 1.

For example, in Formula 1A, a is 0, 1, 2, 3, or 4; b and c may each be independently 1 or 2; $Z_1$ to $Z_4$ may each be independently hydrogen, deuterium, a halogen, a hydroxyl group, a cyano group, a substituted or unsubstituted $C_1$-$C_{10}$ alkyl group, a substituted or unsubstituted $C_1$-$C_{10}$ alkoxy group, a substituted or unsubstituted $C_6$-$C_{20}$ aryl group, or a substituted or unsubstituted $C_2$-$C_{20}$ heteroaryl group; r is an integer of 1 to 4; u is an integer of 1 to 3; and $Ar_4$ and $A_5$ may each be independently a phenyl group, a ($C_1$-$C_{10}$ alkyl)phenyl group, a di($C_1$-$C_{10}$ alkyl)phenyl group, a ($C_6$-$C_{14}$ aryl)phenyl group, a di($C_6$-$C_{14}$ aryl)phenyl group, a naphthyl group, a ($C_1$-$C_{10}$ alkyl)naphthyl group, a di($C_1$-$C_{10}$ alkyl)naphthyl group, a ($C_6$-$C_{14}$ aryl)naphthyl group, a di($C_6$-$C_{14}$ aryl)naphthyl group, an anthryl group, a ($C_1$-$C_{10}$ alkyl)anthryl group, a di($C_1$-$C_{10}$ alkyl)anthryl group, a ($C_6$-$C_{14}$ aryl)anthryl group, a di($C_6$-$C_{14}$ aryl)anthryl group, a fluorenyl group, a ($C_1$-$C_{10}$ alkyl)fluorenyl group, a di($C_1$-$C_{10}$ alkyl)fluorenyl group, a ($C_6$-$C_{14}$ aryl)fluorenyl group, a di($C_6$-$C_{14}$ aryl)fluorenyl group, a phenanthryl group, a ($C_1$-$C_{10}$ alkyl)phenanthryl group, a di($C_1$-$C_{10}$ alkyl)phenanthryl group, a ($C_6$-$C_{14}$ aryl)phenanthryl group, or a di($C_6$-$C_{14}$ aryl)phenanthryl group, but are not limited thereto.

In Formula 1A, $Z_3$ and $Z_4$ may be a $C_1$-$C_{10}$ alkyl group.

The polymer may further include a second repeating unit represented by Formula 3 below, in addition to the first repeating unit:

Formula 3

For example, $Ar_4$ and $Ar_5$ may each be independently a substituted or unsubstituted phenyl group, a substituted or unsubstituted pentalenylene group, a substituted or unsubstituted biphenylenyl group, a substituted or unsubstituted indenyl group, a substituted or unsubstituted naphthyl group, a substituted or unsubstituted azulenyl group, a substituted or unsubstituted heptalenylene group, a substituted or unsubstituted indacenyl group, a substituted or unsubstituted acenaphthyl group, a substituted or unsubstituted fluorenyl group, a substituted or unsubstituted phenalenyl group, a substituted or unsubstituted phenanthryl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl, or a substituted or unsubstituted hexacenyl, but are not limited thereto.

For example, $Ar_4$ and $A_5$ may each be independently a phenyl group, a ($C_1$-$C_{10}$ alkyl)phenyl group, a di($C_1$-$C_{10}$ alkyl)phenyl group, a ($C_6$-$C_{14}$ aryl)phenyl group, a di($C_6$-$C_{14}$ aryl)phenyl group, a naphthyl group, a ($C_1$-$C_{10}$ alkyl)naphthyl group, a di($C_1$-$C_{10}$ alkyl)naphthyl group, a ($C_6$-$C_{14}$ aryl) naphthyl group, a di($C_6$-$C_{14}$ aryl)naphthyl group, an anthryl group, a ($C_1$-$C_{10}$ alkyl)anthryl group, a di($C_1$-$C_{10}$ alkyl)anthryl group, a ($C_6$-$C_{14}$ aryl)anthryl group, a di($C_6$-$C_{14}$ aryl) anthryl group, a fluorenyl group, a ($C_1$-$C_{10}$ alkyl)fluorenyl group, a di($C_1$-$C_{10}$ alkyl)fluorenyl group, a ($C_6$-$C_{14}$ aryl)fluorenyl group, a di($C_6$-$C_{14}$ aryl)fluorenyl group, a phenanthryl group, a ($C_1$-$C_{10}$ alkyl)phenanthryl group, a di($C_1$-$C_{10}$ alkyl) phenanthryl group, a ($C_6$-$C_{14}$ aryl)phenanthryl group, or a di($C_6$-$C_{14}$ aryl)phenanthryl group.

In Formula 3, $Ar_6$ may be a substituted or unsubstituted $C_6$-$C_{30}$ arylene group, as defined for $Ar_1$ above. Thus representative examples of $Ar_6$ may be understood by referring to the examples of $Ar_1$ above.

For example, $Ar_6$ may be a substituted or unsubstituted biphenylenylene group, a substituted or unsubstituted fluorenylene group, a substituted or unsubstituted phenanthrylene group, a substituted or unsubstituted triphenylenylene, or a substituted or unsubstituted phenylene group, but are not limited thereto.

According to an embodiment, $Ar_6$ may be represented by Formula 3A, 3B, or 3C below:

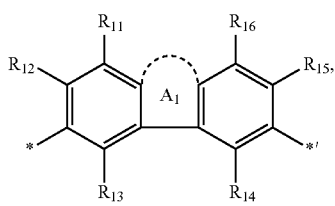

Formula 3A

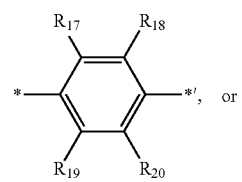

Formula 3B

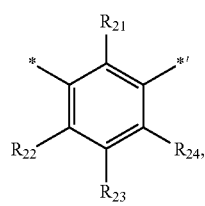

Formula 3C wherein in Formulas 3A through 3C ring $A_1$ is

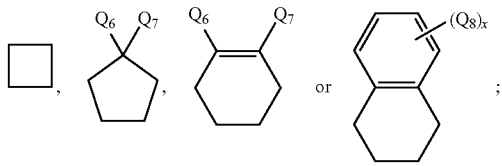

;

$R_{11}$ to $R_{24}$ may each be independently hydrogen, deuterium, a halogen, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{50}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —N($Q_9$)($Q_{10}$), or —Si($Q_{11}$)($Q_{12}$)($Q_{13}$);

$Q_6$ to $Q_{13}$ may each be independently hydrogen, deuterium, a halogen, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_2$-$C_{60}$ heteroaryl group; and x is an integer of 1 to 4.

In Formulas 3A through 3C, $R_{11}$ to $R_{24}$ may each be independently hydrogen, deuterium, a halogen, a hydroxyl group, a cyano group, a nitro group, a carboxyl group, a $C_1$-$C_{10}$ alkyl group (for example, methyl, ethyl, propyl, butyl, or pentyl), a $C_1$-$C_{10}$ alkoxy group (for example, methoxy, ethoxy, propoxy, butoxy, or pentoxy), a $C_6$-$C_{20}$ aryl group (for example, phenyl, naphthyl, anthryl, or fluorenyl), or a $C_2$-$C_{60}$ heteroaryl group (for example, carbazolyl, or pyridyl).

In Formulas 3A through 3C, $Q_6$ to $Q_8$ may each be independently hydrogen, deuterium, a halogen, a hydroxyl group, a cyano group, a nitro group, a carboxyl group, a $C_1$-$C_{10}$ alkyl group, a $C_2$-$C_{10}$ alkenyl group, a $C_1$-$C_{10}$ alkoxy group, phenyl group, a ($C_1$-$C_{10}$ alkyl)phenyl group, a di($C_1$-$C_{10}$ alkyl)phenyl group, a ($C_1$-$C_{10}$ alkoxy)phenyl group, or a di($C_1$-$C_{10}$ alkoxy)phenyl group.

Formula 3A may have various structures represented by Formula 3A-1, 3A-2, 3A-3, and 3A-4 below according to ring $A_1$. Thus, $Ar_6$ may be represented by Formula 3A-1, 3A-2, 3A-3, or 3A-4:

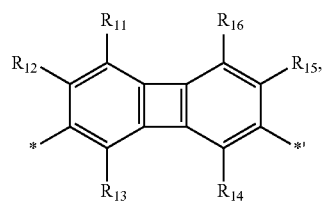

Formula 3A-1

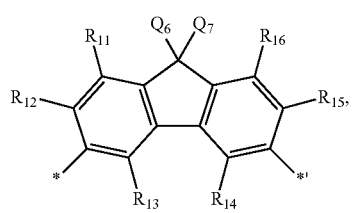

Formula 3A-2

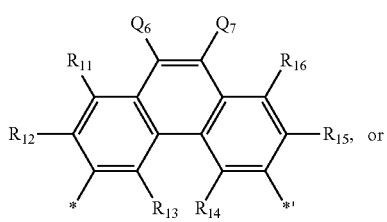

Formula 3A-3

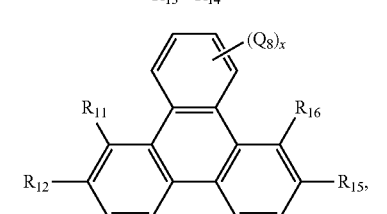

Formula 3A-4 wherein in Formulas 3A-1 through 3A-4, $R_{11}$ to $R_{16}$ and $Q_6$ to $Q_8$ are as previously described with reference to Formula 3A.

For example, in Formulas 3A-1 through 3A-4, $R_{11}$ to $R_{16}$ and $Q_6$ to $Q_8$ may each be independently hydrogen, deuterium, a halogen, a hydroxyl group, a cyano group, a nitro group, a carboxyl group, a $C_1$-$C_{10}$ alkyl group, a $C_2$-$C_{10}$ alkenyl group, a $C_1$-$C_{10}$ alkoxy group, phenyl group, a ($C_1$-$C_{10}$ alkyl)phenyl group, a di($C_1$-$C_{10}$ alkyl)phenyl group, a ($C_1$-$C_{10}$ alkoxy)phenyl group, or a di($C_1$-$C_{10}$ alkoxy)phenyl group, but are not limited thereto.

According to an embodiment, the second repeating unit may be represented by Formula 4A or 4B:

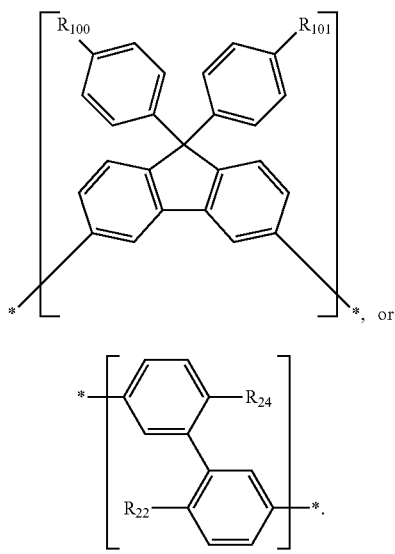

Formula 4A

Formula 4B

Formula 4B is an example of Formula 3 when $Ar_6$ is Formula 3C and e is 2.

In Formulas 4A and 4B, $R_{100}$, $R_{101}$, $R_{22}$, and $R_{24}$ may each be independently a $C_1$-$C_{10}$ alkyl group, or a $C_1$-$C_{10}$ alkoxy group, but are not limited thereto.

In Formula 3, e is an integer of 1 to 10. For example, e may be 1, 2, 3, or 4. If e is equal to or greater than 2, two or more $Ar_6$ may be identical to or different from each other.

The polymer may further include additional repeating units, so long as the additional units do not adversely affect the desired properties of the polymer. The additional repeating units may have 6 to 36, specifically 8 to 30, more specifically 10 to 24 carbon atoms.

A polymer including the first repeating unit and the second repeating unit may be, for example, a block copolymer or a random copolymer. A mole ratio of the first repeating unit to the second repeating unit in the polymer may be about 0.01: 0.99 to about 0.99:0.01, specifically about 0.05:0.95 to about 0.95:0.05, more specifically about 0.1:0.9 to about 0.9:0.1, but is not limited thereto. If the mole ratio is within the foregoing range, the polymer has excellent electron transporting characteristics and high triplet energy.

A weight average molecular weight of the polymer may be about 2,000 to about 1,000,000 Daltons, specifically about 4,000 to about 800,000 Daltons, more specifically about 6,000 to about 600,000 Daltons, based on polystyrene, but is not limited thereto, and a polydispersity index ("PDI") of the polymer may be about 1.5 to about 5, specifically about 2 to about 4.5, more specifically about 2.5 to about 4, but is not limited thereto. The weight average molecular weight and the PDI may be measured by, for example, gel permeation chromatography ("GPC") based on polystyrene, and may be appropriately determined in consideration of, for example, the structure and characteristics of an organic light-emitting device including the polymer.

The term "substituted" as used herein refers to a compound in which at least one hydrogen is independently substituted with a deuterium, a halogen, a hydroxyl group (—OH), a nitro group (—NO$_2$), a cyano group (—CN), an amidino group (—C(=NH)NH$_2$), a hydrazinyl group (—NHNH$_2$), a carboxylic acid group (—C(=O)OH) or a salt derivative thereof (—C(=O)OM) wherein M is an organic or inorganic anion, a sulfonic acid group (—SO$_3$H$_2$) or a mono- or dibasic salt derivative thereof (—SO$_3$ MH or —SO$_3$M$_2$ wherein M is an organic or inorganic anion), a phosphoric acid group (—PO$_3$H$_2$) or a mono- or dibasic salt derivative thereof (—PO$_3$ MH or —PO$_3$M$_2$ wherein M is an organic or inorganic anion), a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_6$-$C_{60}$ aryloxy group, a substituted or unsubstituted $C_2$-$C_{60}$ heteroaryl group, —N($Q_{101}$)($Q_{102}$), or —Si($Q_{103}$)($Q_{104}$)($Q_{105}$) where $Q_{101}$ to $Q_{105}$ may each be independently hydrogen, a halogen, a hydroxyl group, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_6$-$C_{60}$ aryloxy group, or a substituted or unsubstituted $C_2$-$C_{60}$ heteroaryl group, instead of hydrogen, provided that the substituted atom's normal valence is not exceeded. If there are two or more substituents they may be independently selected, and thus the substituents may be identical or different from each other.

In an embodiment, each hydrogen may be independently substituted with deuterium, a halogen, a hydroxyl group, a cyano group, a substituted or unsubstituted $C_1$-$C_{10}$ alkyl group, a substituted or unsubstituted $C_1$-$C_{10}$ alkoxy group, a substituted or unsubstituted $C_6$-$C_{20}$ aryl group, a substituted or unsubstituted $C_2$-$C_{20}$ heteroaryl group, —N($Q_{101}$)($Q_{102}$), or —Si($Q_{103}$)($Q_{104}$)($Q_{105}$) where $Q_{101}$ to $Q_{105}$ may each be independently hydrogen, a halogen, a hydroxyl group, a cyano group, a substituted or unsubstituted $C_1$-$C_{10}$ alkyl group, a substituted or unsubstituted $C_1$-$C_{10}$ alkoxy group, a substituted or unsubstituted $C_6$-$C_{20}$ aryl group, or a substituted or unsubstituted $C_2$-$C_{20}$ heteroaryl group, instead of hydrogen, provided that the substituted atom's normal valence is not exceeded.

In another embodiment, each hydrogen may be independently substituted with deuterium, a halogen, a hydroxyl group, a cyano group, a $C_1$-$C_{10}$ alkyl group, a $C_1$-$C_{10}$ alkoxy group, a $C_6$-$C_{20}$ aryl group, a $C_2$-$C_{20}$ heteroaryl group, —N($Q_{101}$)($Q_{102}$), or —Si($Q_{103}$)($Q_{104}$)($Q_{105}$) where $Q_{101}$ to $Q_{105}$ may each be independently hydrogen, a halogen, a hydroxyl group, a cyano group, a $C_1$-$C_{10}$ alkyl group, a $C_1$-$C_{10}$ alkoxy group, a $C_6$-$C_{20}$ aryl group, or a $C_2$-$C_{20}$ heteroaryl group, instead of hydrogen, provided that the substituted atom's normal valence is not exceeded.

In yet another embodiment, each hydrogen may independently be substituted with deuterium, a halogen, a hydroxyl group, a cyano group, a methyl group, an ethyl group, a propyl group, a butyl group, a pentyl group, a methoxy group, an ethoxy group, a propoxy group, a pentoxy group, a phenyl group, a naphthyl group, or an anthryl group, instead of hydrogen, provided that the substituted atom's normal valence is not exceeded.

"Alkyl" means a straight or branched chain, saturated, monovalent hydrocarbon group. The $C_1$-$C_{60}$ alkyl group may be substituted or unsubstituted, and may have a linear or branched structure, and non-limiting examples thereof include methyl, ethyl, propyl, isobutyl, sec-butyl, pentyl, isoamyl, hexyl, heptyl, octyl, and nonyl groups. A substituent of the substituted $C_1$-$C_{60}$ alkyl group may be any of the substituents presented above.

"Alkenyl" means a straight or branched chain, monovalent hydrocarbon group having at least one carbon-carbon double bond (e.g., ethenyl (—HC=CH$_2$)). The $C_2$-$C_{60}$ alkenyl group may be substituted or unsubstituted, and the carbon-carbon double blond may be at the center or at a terminal end of the unsubstituted an unsubstituted $C_2$-$C_{50}$ alkenyl group. Non-limiting examples of the $C_2$-$C_{60}$ alkenyl group include ethenyl, propenyl, butenyl, pentenyl, hexenyl, heptenyl, octenyl, propadienyl, isoprenyl, and allyl. A substituent of the substituted $C_2$-$C_{60}$ alkenyl group may be any of the substituents presented above.

"Alkynyl" means a straight or branched chain, monovalent hydrocarbon group having at least one carbon-carbon triple bond. The $C_2$-$C_{60}$ alkynyl group may be substituted or unsubstituted and may have at least one carbon-carbon triple bond at the center or at a terminal end of the unsubstituted an unsubstituted $C_2$-$C_{60}$ alkynyl group. Non-limiting examples of the $C_2$-$C_{60}$ alkynyl group include an acetylenyl, e.g., ethynyl group. A substituent of the substituted $C_2$-$C_{60}$ alkynyl group may be any of the substituents presented above.

"Alkoxy" means an alkyl group that is linked via an oxygen (i.e., alkyl-O—), for example methoxy, ethoxy, and sec-butyloxy groups. The $C_1$-$C_{60}$ alkoxy group may be substituted or unsubstituted. The alkoxy group may have a formula represented by —OY where Y is the $C_1$-$C_{60}$ alkyl group as defined above. Non-limiting examples of the unsubstituted $C_1$-$C_{60}$ alkoxy group include methoxy, ethoxy, isopropoxy, butoxy, and pentoxy. A substituent of the substituted $C_1$-$C_{60}$ alkoxy group may be any of the substituents presented above.

"Cycloalkyl" means a monovalent group having one or more saturated rings in which all ring members are carbon. The $C_3$-$C_{60}$ cycloalkyl group may be saturated or unsaturated. Non-limiting examples of the $C_3$-$C_{60}$ cycloalkyl group include cyclopropyl, cyclobutyl, cyclopentyl, cyclohexyl, and cyclooctyl. A substituent of the substituted $C_1$-$C_{60}$ cycloalkyl group may be any of the substituents presented above.

"Cycloalkenyl" means a monovalent group having one or more rings and one or more carbon-carbon double bonds in the ring, wherein all ring members are carbon. The $C_3$-$C_{60}$ cycloalkenyl group may be saturated or unsubstituted. Cycloalkyl groups do not include an aromatic ring or a heterocyclic ring. Non-limiting examples of the $C_3$-$C_{60}$ cycloalkenyl group include cyclopropenyl, cyclobutenyl, cyclopentenyl, cyclohexenyl, cycloheptenyl, 1,3-cyclohexadienyl, 1,4-cyclohexadienyl, 2,4-cycloheptadienyl, and 1,5-cyclooctadienyl. A substituent of the substituted $C_3$-$C_{60}$ cycloalkenyl group may be any of the substituents presented above.

"Aryl," means a cyclic moiety in which all ring members are carbon and at least one ring is aromatic, the moiety having the specified number of carbon atoms. The $C_6$-$C_{60}$ aryl group may be substituted or unsubstituted, and refers to a monovalent group having a carbocyclic aromatic system in which the number of carbon atoms is 6 to 60, and may be a monocyclic group or a polycyclic group. If the $C_6$-$C_{60}$ aryl group is a polycyclic group, two or more rings contained in the $C_6$-$C_{60}$ aryl group may be fused. Non-limiting examples of the $C_6$-$C_{60}$ aryl group include phenyl, pentalenyl, indenyl, naphthyl, azulenyl, heptalenylene, indacenyl, acenaphthyl, fluorenyl, spiro-fluorenyl, phenalenyl, phenanthryl, anthryl, fluoranthenyl, triphenylenyl, pyrenyl, chrysenyl, naphthacenyl, picenyl, perylenyl, pentaphenyl, and hexacenyl. A substituent of the substituted $C_6$-$C_{60}$ aryl group may be any of the substituents presented above.

"Aryloxy" means an aryl moiety that is linked via an oxygen (i.e., —O-aryl).

"Arylene" means a divalent radical formed by the removal of two hydrogen atoms from one or more rings of an aromatic hydrocarbon, wherein the hydrogen atoms may be removed from the same or different rings (preferably different rings), each of which rings may be aromatic or nonaromatic. The $C_6$-$C_{60}$ arylene group may be substituted or unsubstituted and refers to a divalent group having a carbocyclic aromatic system in which the number of carbon atoms is 6 to 60, and may be a monocyclic group or a polycyclic group. Examples of the $C_6$-$C_{60}$ arylene group include phenylene and napthylene. A substituent of the substituted $C_6$-$C_{60}$ arylene group may be any of the substituents presented above.

Throughout the present disclosure, reference is made to various heterocyclic groups. Within such groups, the term "hetero" means a group that comprises at least one ring member that is a heteroatom (e.g., 1 to 4 heteroatoms, each independently N, O, S, P, or Si). In each instance, the total number of ring members may be indicated (e.g., a 3- to 10-membered heterocycloalkyl). If multiple rings are present, each ring is independently aromatic, saturated, or partially unsaturated and multiple rings, if present, may be fused, pendant, spirocyclic, or a combination thereof. Heterocycloalkyl groups comprise at least one non-aromatic ring that contains a heteroatom ring member. Heteroaryl groups comprise at least one aromatic ring that contains a heteroatom ring member. Non-aromatic and/or carbocyclic rings may also be present in a heteroaryl group, provided that at least one ring is both aromatic and contains a ring member that is a heteroatom.

The $C_2$-$C_{60}$ heteroaryl group may be substituted or unsubstituted and may be a monocyclic or polycyclic group, each having at least one ring having one or more hetero atoms which may be nitrogen (N), oxygen (O), phosphorous (P), sulfur (S), or silicon (Si). If the $C_2$-$C_{60}$ heteroaryl group is a polycyclic group, two or more rings contained in the unsubstituted $C_2$-$C_{60}$ heteroaryl group may be fused. Non-limiting examples of the $C_2$-$C_{60}$ heteroaryl group include pyrrolyl, imidazolyl, pyrazolyl, pyridinyl, pyrazinyl, pyrimidinyl, pyridazinyl, isoindolyl, indolyl, indazolyl, purinyl, quinolinyl, benzoquinolinyl, phthalazinyl, naphthyridinyl, quinoxalinyl, quinazolinyl, cinnolinyl, carbazolyl, phenanthridinyl, acridinyl, phenanthrolinyl, phenazinyl, benzooxazolyl, benzoimidazolyl, furanyl, benzofuranyl, thiophenyl, benzothiophenyl, thiazolyl, isothiazolyl, benzothiazolyl, isoxazolyl, oxazolyl, triazolyl, tetrazol, oxadiazolyl, triazinyl, and benzooxazolyl groups. A substituent of the substituted $C_6$-$C_{60}$ heteroaryl group may be any of the substituents presented above.

The $C_6$-$C_{60}$ heteroarylene group may be substituted or unsubstituted and as used herein refers to a divalent monocyclic or polycyclic group having at least one ring having one or more hetero atoms which may be nitrogen (N), oxygen (O), phosphorous (P), sulfur (S), or silicon (Si). Examples of the $C_6$-$C_{60}$ heteroarylene group may be understood by referring to the examples of the $C_6$-$C_{60}$ heteroaryl group above. A substituent of the substituted $C_6$-$C_{60}$ heteroarylene group may be any of the substituents presented above.

The expression "*" used herein refers to a binding site with an adjacent moiety, as would be understood to one of ordinary skill in the art.

The polymer including the repeating unit represented by Formula 1 may be synthesized by using a known organic synthesis method, for example, Suzuki coupling or Yamamoto coupling. The synthesis methods may be determined by one of ordinary skill in the art without undue experimentation with reference to examples which are presented herein.

The polymer including the first repeating unit represented by Formula 1 has a triazine ring. While not wanting to be bound by theory, it is believed that the polymer has electron-deficient characteristics in the main chain of the polymer, and due to the inclusion of the triazine ring, the polymer has excellent electron transporting characteristics. For example, the polymer may have an electron conductivity of greater than an electron conductivity of a polyfluorene.

Also, linking between carbons at positions 3 and 6 (see Formula 3A) in adjacent benzene rings of the second repeating unit may contribute to maintenance of an energy band gap ("Eg") and triplet energy ("$E_T$") at high levels even when a conjugation length of the polymer is increased.

Accordingly, the polymer may be used in an organic light-emitting device, for example, as a phosphorescent host which is used together with a phosphorescent dopant in an emitting layer of an organic light-emitting device.

Layers comprising the polymer can be formed using spin coating, dip coating, blade coating, casting, roll coating, bar coating, or vacuum deposition, for example. For example, a layer comprising the polymer can be formed by providing a mixture comprising the polymer and a solvent (for example, chlorobenzene, tetrahydrofuran) on a support on which the layer comprising the polymer is formed (for example, on the first electrode) and heat-treating the resultant to obtain the layer comprising the polymer.

Unlike a fluorescent material having a maximum internal quantum efficiency of 25%, in which only singlet state energy contributes to light-emission, a phosphorescent material that enables intersystem crossing between singlet state energy and triplet state energy has, in theory, a maximum internal quantum efficiency of 100% since excitons having triplet state energy also contribute to light-emission. Accordingly and while not wanting to be bound by theory, an organic light-emitting device including a phosphorescent material has high efficiency. If a high level of triplet state energy of a known phosphorescent dopant and characteristics of the polymer described above are taken into consideration, it is deemed that the polymer is suitable for use as a phosphorescent host in an emitting layer of an organic light-emitting device. Also, the emitting layer including the polymer additionally performs as a hole blocking layer so that triplet excitons may be effectively confined in the emitting layer, and lowers an injection barrier for electrons injected from a cathode, thereby enabling production of a high-quality organic light-emitting device.

For example, the polymer may be used as a red, green, and/or blue phosphorescent host in an emitting layer of an organic light-emitting device. According to an embodiment, the polymer may be used as a red and/or green phosphorescent host in an emitting layer of an organic light-emitting device, but is not limited thereto.

Accordingly, provided is an organic light-emitting device including a substrate; a first electrode on the substrate; a second electrode on the first electrode; and a first layer which is disposed between the first electrode and the second electrode and includes the polymer including the repeating unit represented by Formula 1.

The first layer may function as, for example, an emitting layer.

If the first layer is an emitting layer, the first layer may further include a phosphorescent dopant. The phosphorescent dopant may be any known phosphorescent dopant. For example, the phosphorescent dopant may be an organometallic complex including iridium (Ir), platinum (Pt), osmium (Os), rhenium (Re), titanium (Ti), zirconium (Zr), hafnium (Hf), or a combination thereof, but is not limited thereto.

Non-limiting examples of the phosphorescent dopant include bisthienylpyridine acetylacetonate iridium, bis(benzothienylpyridine)acetylacetonate iridium, bis(2-phenylbenzothiazole)acetylacetonate iridium, bis(1-phenylisoquinoline) iridium acetylacetonate, tris(1-phenylisoquinoline) iridium, tris(phenylpyridine) iridium, tris(2-biphenylpyridine) iridium, tris(3-biphenylpyridine) iridium, tris(4-biphenylpyridine) iridium, Ir(pq)$_2$(acac) wherein pq is 2-phenylquinoline and acac is acetylacetone (see Compound 10 below), Ir(ppy)$_3$ wherein ppy is phenylpyridine (see Compound 11 below), platinum(II)octaethylporphyrin (PtOEP) whose formula is presented below, Compound 12 below, Firpic (see Compound 13 below), Ir(piq)$_3$ whose formula is presented below and wherein piq is phenylisoquinoline, Ir(piq)$_2$acac (see Compound 14 below), Ir(mppy)$_3$ (see Compound 15 blow), Btp$_2$Ir(acac) whose formula is presented below, F$_2$Irpic whose formula is presented below, (F$_2$ ppy)$_2$Ir (tmd) whose formula is presented below, Ir(dfppz)$_3$ whose formula is presented below, or a combination thereof:

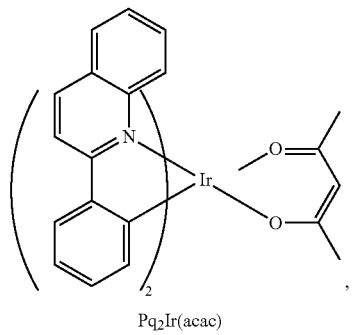

Compound 10

Pq$_2$Ir(acac)

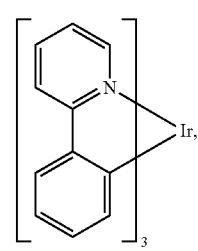

Compound 11

Compound 12
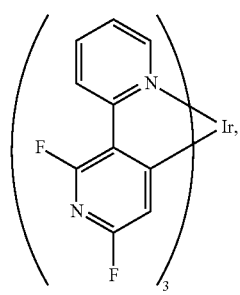
Compound 13
Compound 14
Compound 15
PtOEP
Ir(piq)₃
Btp₂Ir(acac)
F₂Irpic
(F₂ppy)₂Ir(tmd)

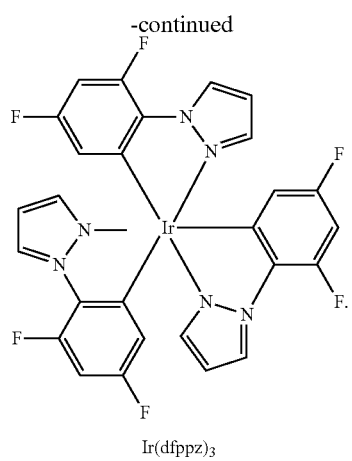

Ir(dfppz)₃

In addition to the first layer which may function as, for example, an emitting layer, a hole injection layer, a hole transport layer, a hole blocking layer, an electron transport layer, an electron injection layer, or any combination thereof may be further disposed between the first electrode and the second electrode of the organic light-emitting device.

FIG. 1 is a schematic sectional view of an embodiment of an organic light-emitting device 10. The organic light-emitting device 10 includes a substrate 11, a first electrode 12, a hole transport layer 13, a first layer 15, an electron transport layer 16, an electron injection layer 18, and a second electrode 19. The first layer 15 may function as an emitting layer. The organic light-emitting device 10 and a method of manufacturing the organic light-emitting device 10 will now be disclosed in further detail.

First, a first electrode material having a high work function may be disposed on the substrate 11 to form the first electrode 12. The first electrode material may be disposed by depositing, ion-plating, plating, or sputtering. The first electrode 12 may be an anode through which holes are injected or a cathode through which electrons are injected. The substrate 11 may be any one of various substrates that are used in a commercially available organic light-emitting device, and may be a glass substrate or a transparent plastic substrate. The substrate desirably has excellent mechanical strength, thermal stability, transparency, surface smoothness, ease of handling, and water repellence. The first electrode material may be a metal oxide, a metal sulfide, or a metal, each of which has high electrical conductivity, and in general, these materials are used as a thin film. Examples of the first electrode material include an oxide, such as an indium oxide, a zinc oxide, a tin oxide, an indium tin oxide ("ITO"), or an indium zinc oxide ("IZO"), gold, platinum, or copper. The first electrode material may also be polyaniline or a derivative thereof, or polytheophene or a derivative thereof. The first electrode 12 may have a one-layer structure or a multi-layer structure including two or more layers, and may include two or more different materials. A thickness of the first electrode 12 may be appropriately controlled in consideration of transmissivity of light and electrical conductivity, and may be, for example, about 10 nanometers (nm) to about 10 micrometers (μm).

Although not illustrated in FIG. 1, according to another embodiment, if the first electrode 12 is an anode, a hole injection layer may be further formed on the first electrode 12. The hole injection layer may be formed by using any one of various methods, for example, vacuum deposition, spin coating, casting, or Langmuir-Blodgett ("LB") deposition.

When the hole injection layer is formed by vacuum deposition, the deposition conditions may vary according to a material that is used to form the hole injection layer, and the structure and thermal characteristics of the hole injection layer. For example, the deposition conditions may include a deposition temperature of about 100 to about 500° C., specifically about 200 to about 400° C. a vacuum pressure of about $10^{-8}$ to about $10^{-3}$ torr, specifically about $10^{-7}$ to about $10^{-4}$ torr, and a deposition rate of about 0.01 to about 100 angstroms per second (Å/sec), specifically about 0.1 to about 50 Å/sec.

When the hole injection layer is formed using spin coating, coating conditions may vary according to the material used to form the hole injection layer, and the structure and thermal properties of the hole injection layer. For example, the coating conditions may include a coating speed of about 2000 to about 5000 revolutions per minute (rpm), specifically about 2500 to about 4500 rpm, and a thermal treatment temperature of about 80 to about 300° C., specifically about 100 to about 200° C. wherein the thermal treatment serves to remove the solvent after coating.

A material that is used to form the hole injection layer may be any known hole injecting material. Non-limiting examples of the material include a phthalocyanine compound, such as copper phthalocyanine, 4,4',4"-tris(3-methylphenylphenylamino) triphenylamine ("m-MTDATA") whose formula is presented below, N,N'-di(1-naphthyl)-N,N'-diphenylbenzidine ("NPB"), TDATA whose formula is presented below, and 2T-NATA whose formula is presented below:

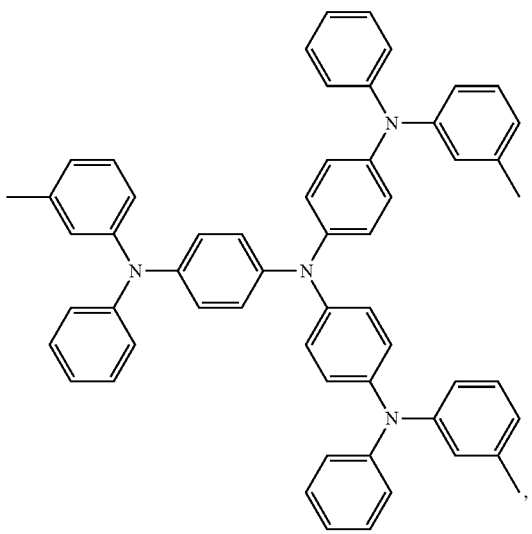

m-MTDATA

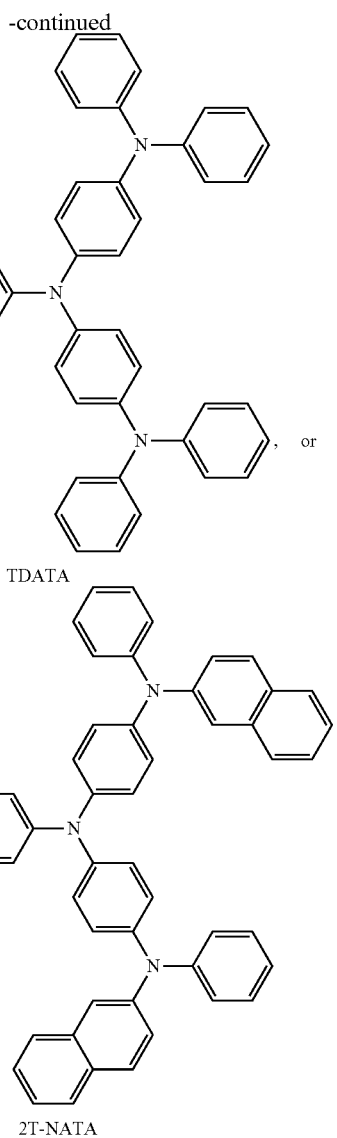

TDATA

2T-NATA

The hole injection layer may have a thickness of about 100 to about 10000 Å, specifically a thickness of about 100 to about 1000 Å. When the thickness of the hole injection layer is within the foregoing range, the hole injection layer may have suitable hole injection characteristics without an increase in driving voltage.

The hole transport layer 13 may be formed on the first electrode 12 or the hole injection layer by vacuum deposition, spin coating, casting, or LB deposition.

When the hole transport layer is formed by vacuum deposition or spin coating, the deposition or coating conditions may be similar to those applied to form the hole injection layer, although the deposition or coating conditions may vary according to the material that is used to form the hole transport layer.

A material that is used to form the hole transport layer 13 may be any of known hole transport materials. Non-limiting examples of the material that may be used to form the hole transport layer 13 include an amine derivative including an aromatic fused ring, such as N,N'-bis(3-methylphenyl)-N,N'-diphenyl-[1,1-biphenyl]-4,4'-diamine ("TPD") whose formula is presented below, polyaniline/dodecylbenzene sulfonic acid ("Pani/DBSA") whose formula is presented below, poly(3,4-ethylenedioxythiophene)/poly(4-styrenesulfonate) ("PEDOT/PSS") whose formula is presented below, polyaniline/camphor sulfonic acid ("Pani/CSA"), or polyaniline/poly(4-styrenesulfonate) ("PANI/PSS").

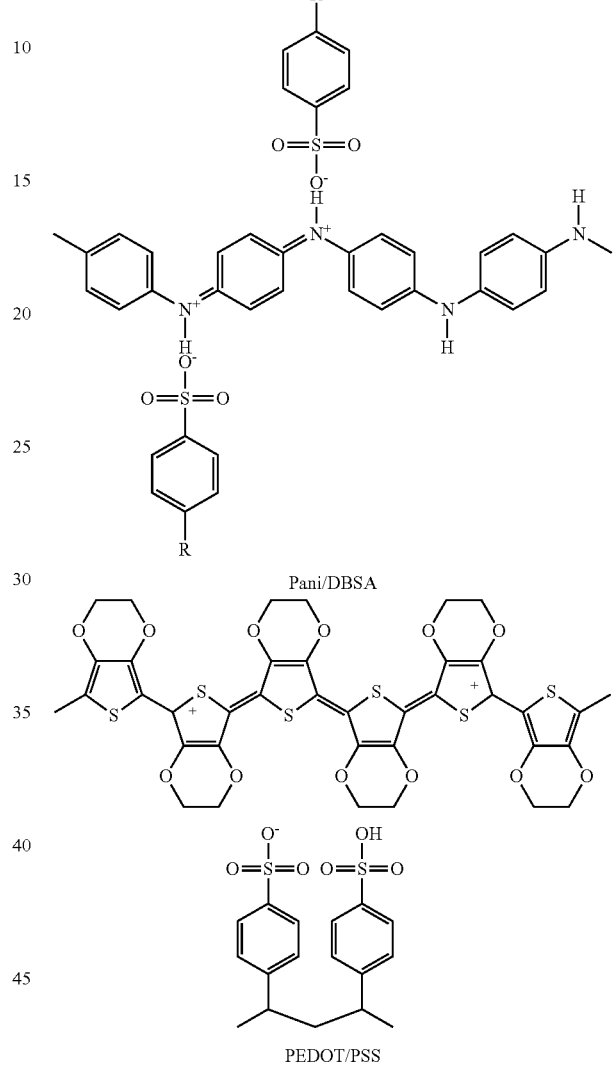

Pani/DBSA

PEDOT/PSS

The hole transport layer 13 may have a thickness of about 50 to about 1000 Å, specifically a thickness of about 100 to about 600 Å. When the thickness of the hole transport layer 13 is within the foregoing range, the hole transport layer 13 may have excellent hole transport characteristics without an increase in driving voltage.

The first layer 15, which may functions as an emitting layer, may be formed on the hole transport layer 13. The first layer 15 may be formed by spin coating, casting, or LB deposition. If the first layer 15 is formed by spin coating, the coating conditions may be similar to those used to form the hole injection layer, although the coating conditions may vary according to the polymer and/or compound that is used to form the first layer 15.

The first layer 15 may include the polymer having the repeating unit represented by Formula 1 as a host. Also, the first layer 15 may further include a phosphorescent dopant, in addition to the polymer having the repeating unit represented by Formula 1. Examples of the phosphorescent dopant are further described above.

If the first layer 15 includes the polymer having the repeating unit represented by Formula 1 and a phosphorescent dopant, an amount of the phosphorescent dopant contained in the first layer 15 may be about 1 to about 10 weight percent (wt. %), based on the total weight of the first layer 15. If the amount of the phosphorescent dopant is within the foregoing range, concentration quenching may be substantially prevented.

The first layer 15 may include only the polymer having the repeating unit represented by Formula 1. Alternatively, the first layer 15 may include the polymer having the repeating unit represented by Formula 1 and a known fluorescent dopant. However, the first layer 15 is not limited thereto.

A thickness of the first layer 15, which may function as an emitting layer, may be about 100 to about 1000 μm, for example, about 200 to about 900 μm. If the thickness of the first layer 15 is within the foregoing range, the first layer 15 may have suitable light-emitting characteristics without an increase in driving voltage.

Although not illustrated in FIG. 1, according to another embodiment, a hole blocking layer may be further disposed on the first layer 15.

The hole blocking layer may substantially or effectively prevent diffusion of triplet excitons or holes in the first layer 15, which functions as an emitting layer, to the second electrode 19. The hole blocking layer may be may be formed by vacuum deposition, spin coating, casting, or LB deposition. If the hole blocking layer is formed by vacuum deposition or spin coating, the deposition or coating conditions may be similar to those applied to form the hole injection layer, although the deposition or coating conditions may vary according to the material that is used to form the hole blocking layer. Non-limiting examples of the hole blocking material include an oxadiazole, a triazole, a phenanthroline, or TAZ whose formula is presented below:

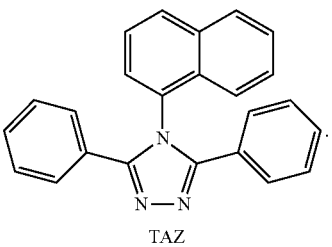 [SMILES: c1ccc(-c2nnc(-c3ccccc3)n2-c2cccc3ccccc23)cc1]

TAZ

A thickness of the hole blocking layer may be about 50 to about 1000 μm, specifically about 100 to about 300 μm. If the thickness of the hole blocking layer is within the foregoing range, the hole blocking layer may have satisfactory hole blocking characteristics.

Next, the electron transport layer 16 is formed on the first layer 15 or the hole blocking layer by a method such as vacuum deposition, spin coating, or casting. If the electron transport layer 16 is formed by vacuum deposition or spin coating, the deposition or coating conditions may be similar to those applied to form the hole injection layer, although the deposition or coating conditions may vary according to the material that is used to form the electron transport layer 16. A material that is used to form the electron transport layer 16 may be a material that stably transports electrons injected through an electrode injection electrode (e.g., the cathode).

Non-limiting examples of the material that may be used to form the electron transport layer 16 include a quinoline, 4,7-diphenyl-1,10-phenanthroline ("Bphen"), BAlq whose formula is presented below, tris(8-quinolinorate)aluminum ("Alq3"), beryllium bis(benzoquinolin-10-olate) ("Bebq$_2$"), or TPBi whose formula is presented below:

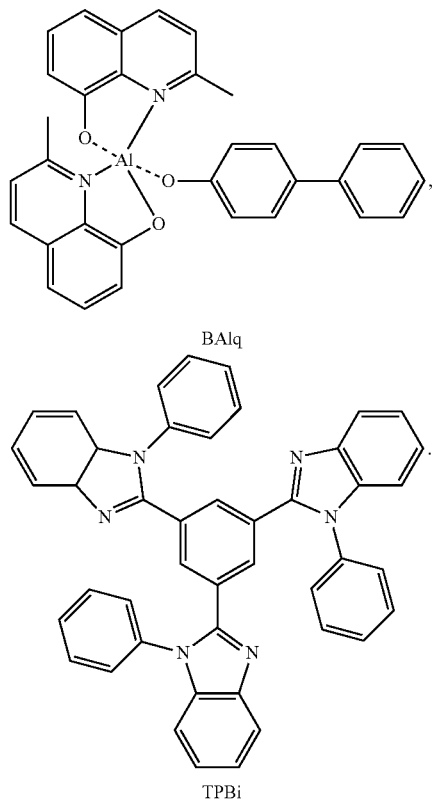

The electron transport layer 16 may have a thickness of about 100 to about 1,000 Å, specifically about 200 to about 500 Å. If the thickness of the electron transport layer 16 is within the foregoing range, the electron transport layer 16 may have good electron transport characteristics without an increase in driving voltage.

Subsequently, the electron injection layer 18 may be formed on (e.g., disposed on) the electron transport layer 16. A material that is used to form the electron injection layer 18 may be any known materials that may be used to form an electron injection layer, and may be for example LiF, NaCl, CsF, Li$_2$O, BaO, or BaF$_2$. The deposition conditions may be similar to those applied to form the hole injection layer, although the deposition conditions may vary according to the material that is used to form the electron injection layer 18.

The electron injection layer 18 may have a thickness of about 1 to about 100 Å, specifically about 5 to about 50 Å. When the thickness of the electron injection layer 18 is within the foregoing range, the electron injection layer 18 may have good electron injection characteristics without an increase in driving voltage.

Finally, the second electrode 19 may be formed on the electron injection layer 18. A method of forming the second electrode 19 may be substantially similar to the method of forming the first electrode 12 as described above, and thus may be understood by referring to the method of forming the first electrode 12 as described above. The second electrode 19 may be used as a cathode or an anode. If the second electrode 19 is used as a cathode, the second electrode 19 may be formed of a material having a low work function. Examples of the low work function material include an alkali metal, such as lithium, sodium, potassium, rubidium, or cesium, an alkali earth metal, such as beryllium, magnesium, calcium, strontium, or barium, a metal, such as aluminum, scandium, vanadium, zinc, yttrium, indium, cerium, samarium, europium, terbium, or ytterbium, an alloy of at least one of the foregoing, an alloy of two or more of the foregoing, an alloy of at least one of the foregoing, or at least one of gold, silver, plutonium, copper, manganese, titanium, cobalt, nickel, tungsten, or tin, graphite, or a graphite interlayer compound. Examples of the alloy include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy. Also, the second electrode 19 may have a one-layer structure or a multi-layer structure. Also, the second electrode 19 may include only one type of material, or two or more different materials. The second electrode 19 may be transparent, semi-transparent, or reflective. A thickness of the second electrode 19 may be, for example, about 10 nm to about 10 μm, specifically about 50 nm to about 5 μm, but is not limited thereto.

An embodiment will now be disclosed in further detail with reference to the following examples. These examples are for illustrative purposes only and are not intended to limit the scope of the one or more embodiments.

EXAMPLES

Synthesis Example 1

Synthesis of Compound 1

Compound 1 was synthesized according to Reaction Scheme 1 below:

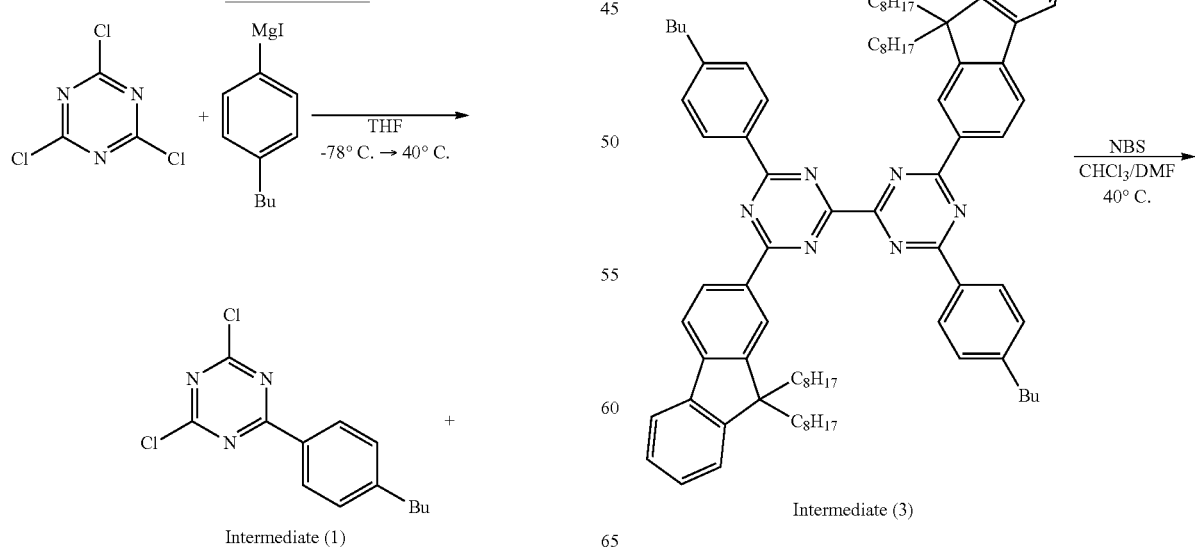

-continued

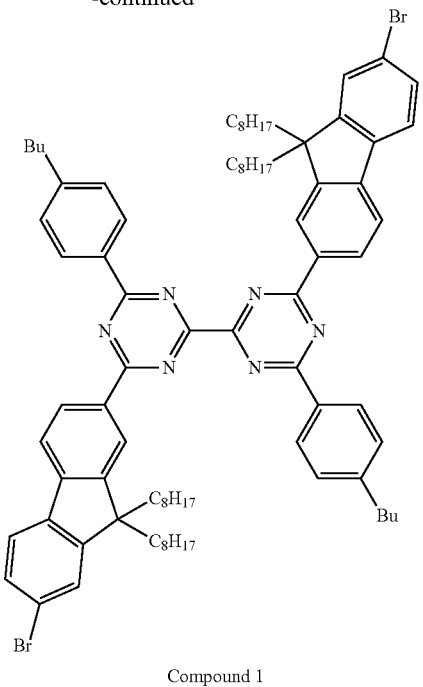

Compound 1

Synthesis of Intermediate (1)

[2-(4-butylphenyl-4,6-dichloro-1,3,5-triazine)]

4-butylphenylmagnesium iodide was prepared from 963 milligrams (mg) (39.6 mmole) of magnesium that was activated with a small amount of $I_2$ in 60 milliliters (mL) of tetrahydrofuran ("THF"), and 6 mL (33 mmole) of 4-bromobutylbenzene. The 4-butylphenylmagnesium iodide was added to a mixture of 18.4 g (99 mmole) of cyanuric chloride in 50 mL of THF at a temperature of −78° C. in a nitrogen atmosphere. The resulting mixture was refluxed for 12 hours, quenched with $H_2O$, and a solvent included therein was removed under reduced pressure. The result was washed with brine, extracted with $CH_2Cl_2$, dried with $MgSO_4$, filtered, concentrated under reduced pressure, and refined by column chromatography to obtain 6.5 grams (g) of Intermediate (1) (Yield: 70%).

$^1$H-NMR (CDCl$_3$, 300 MHz): d 8.43-8.41 (d, 2H 7.36-7.28 (d, 2H 2.75-2.70 (t, 2H 1.69-1.59 (m, 2H 1.43-1.36 (m, 2H 1.03-0.94 (t, 3H)

$^{13}$C-NMR (CDCl$_3$, 75 MHz): d 174.8, 171.8, 150.9, 130.1, 130.0, 129.2, 35.9, 33.1, 22.3, 13.8

Synthesis of Intermediate (2)

[2-(4-butylphenyl)-4-chloro-6-(9,9-dioctyl-9H-fluoren-2-yl)-1,3,5-triazine]

1.5 mL (2.4 mmole) of n-BuLi was dropped into a mixture of 1.5 g (2.9 mmole) of 2-iodo-9,9-dioctyl-9H-fluorene in 30 mL of THF at a temperature of −78° C. After 1 hour, 1.6 g (5.8 mmole) of Intermediate (1) in 20 mL of THF was added to the resulting mixture and the mixture maintained at a temperature of 40° C. After the reaction was completed, the reaction product was quenched with $H_2O$ and a solvent included therein was removed under reduced pressure, extracted with $CH_2Cl_2$, washed with brine, dried with $MgSO_4$, filtered, and concentrated under reduced pressure. The result was refined by column chromatography to obtain 867 mg of Intermediate (2) (Yield: 47%).

Synthesis of Intermediate (3)

In a nitrogen atmosphere, 20 mL of THF was added to a mixture including 0.33 g (0.5 mmol) of dichlorobis(triphenylphosphine)nickel [NiCl$_2$(PPh$_3$)$_2$], 0.20 g (3 mmol) of acid-washed zinc, and 0.55 g (1.5 mmol) of n-Bu$_4$NI. The resulting mixture was stirred for 30 minutes at room temperature to produce a reddish brown mixture. A mixture of 867 mg (1.4 mmol) of Intermediate (2) in THF (10 mL) was added to the reddish brown mixture, and then refluxed for 18 hours. After a reaction was completed, $H_2O$ was added to the reaction product and the resulting solution was filtered, and THF was removed therefrom under reduced pressure. Then, the resulting mixture was extracted with $CH_2Cl_2$, and an organic layer was isolated and washed twice with water, dried with anhydrous $MgSO_4$ and concentrated. The result was re-crystallized with ethyl acetate (EtOAc) to obtain 757 mg of Intermediate (3) (Yield: 45%) that was a white solid.

Synthesis of Compound 1

[4,4'-bis(7-bromo-9,9-dioctyl-9H-fluoren-2-yl)-6,6'-bis(4-butylphenyl)-2,2'-bi(1,3,5-triazine)]

60 mL (1.16 mmole) of Br$_2$ was added to 700 mg (0.58 mmole) of Intermediate (3) in CHCl$_3$ at a temperature of 0° C. After a reaction was completed, Na$_2$S$_2$O$_3$(aq) was added to the reaction product, and the resulting mixture was extracted with $CH_2Cl_2$, dried with $MgSO_4$, and concentrated under reduced pressure. The product was refined by column chromatography to obtain 749 mg of Compound 1 (Yield: 95%).

Synthesis Example 2

Synthesis of Compound 2

Compound 2 was synthesized according to Reaction Scheme 2 below:

Reaction Scheme 2
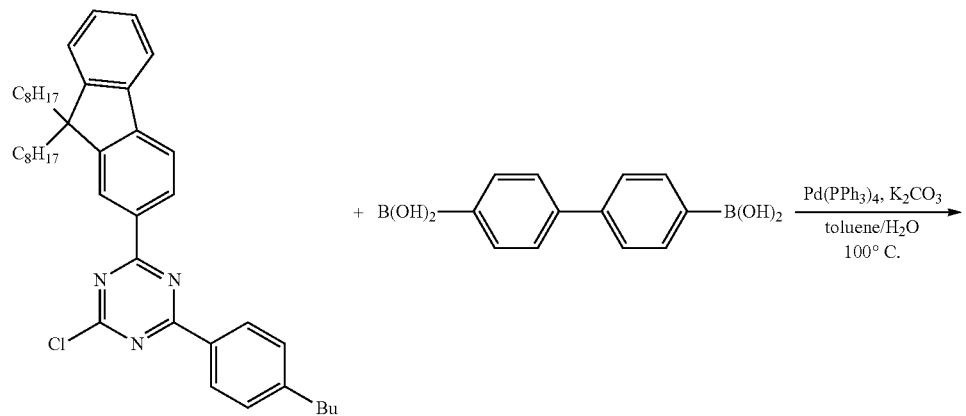
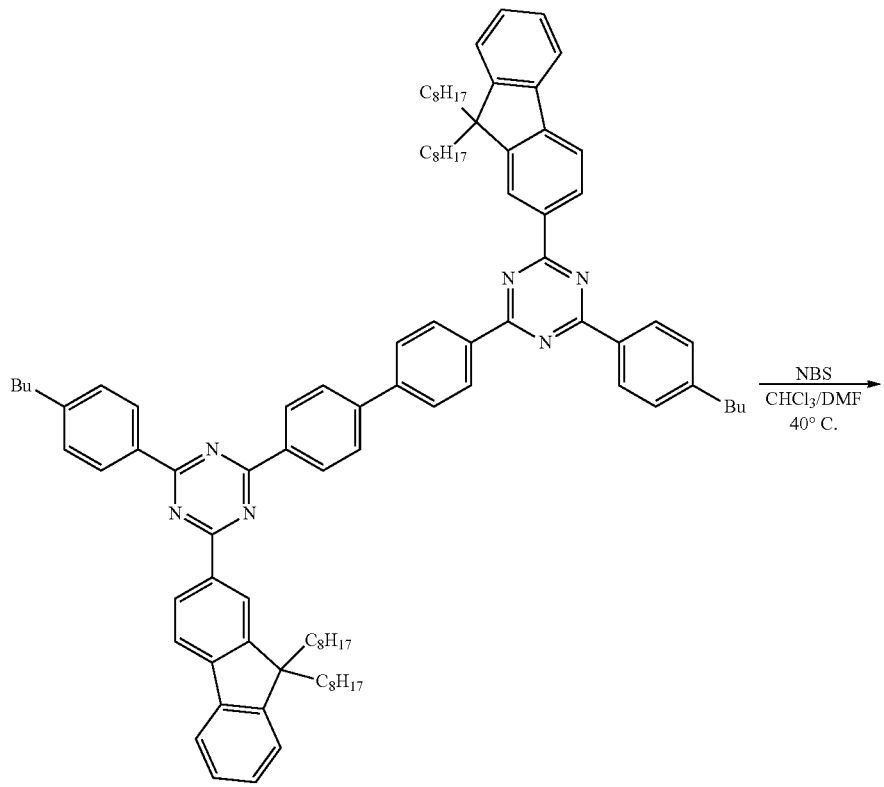
Intermediate (4)

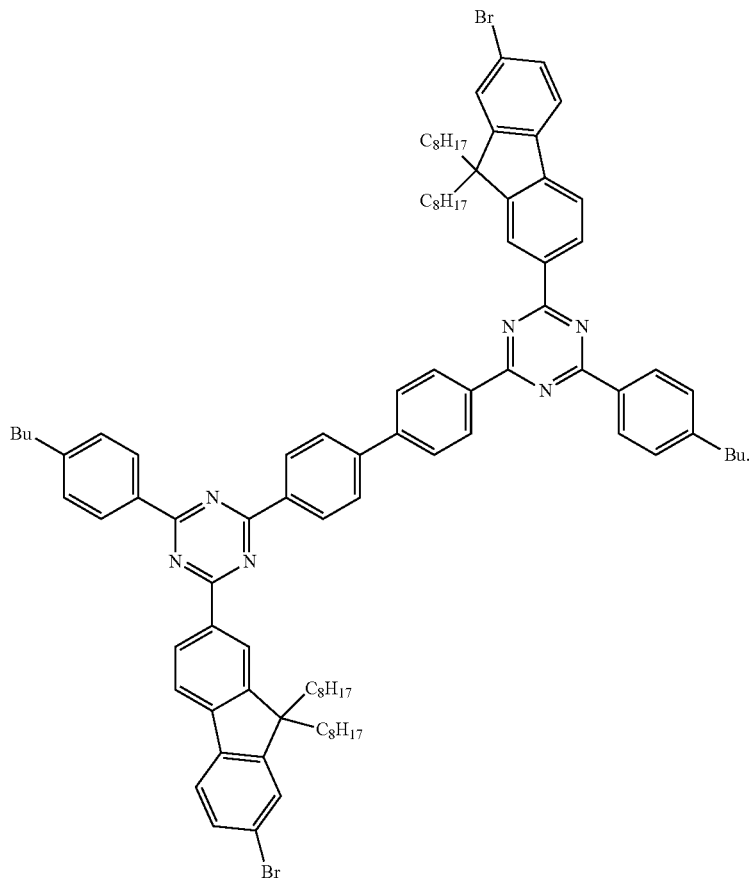

Compound 2

Synthesis of Intermediate(4)

[4,4'-bis(4-(4-butylphenyl)-6-(9,9-dioctyl-9H-fluoren-2-yl)-1,3,5-triazin-2-yl)-1,1'-biphenyl]

A mixture of 1.0 g (1.57 mmole) of Intermediate (2), 191 mg (0.79 mmole) of 4,4'-biphenyldiboronic acid, 36 mg (0.0314 mmole) of tetrakis((triphenylphosphine)palladium (0) (Pd(PPh$_3$)$_4$), and 867 mg (6.28 mmole) of K$_2$CO$_3$ in 30 mL of toluene:H$_2$O(4:1) was heated under reduced pressure at reflux. After a reaction was completed, the mixture was cooled to room temperature, washed with brine, extracted with CH$_2$Cl$_2$, dried with anhydrous MgSO$_4$, and concentrated under reduced pressure. The resulting material was refined by column chromatography to obtain 1.6 g of Intermediate (4) (Yield: 76%).

Synthesis of Compound 2

[4,4'-bis(4-(7-bromo-9,9-dioctyl-9H-fluoren-2-yl)-6-(4-butylphenyl)-1,3,5-triazin-2-yl)-1,1'-biphenyl]

121 mL (2.36 mmole) of Br$_2$ was added to 1.6 g (1.18 mmole) of Intermediate(4) in CHCl$_3$ at a temperature of 0° C. After a reaction was completed, Na$_2$S$_2$O$_3$(aq) was added to the reaction product. Then, the resulting mixture was extracted with CH$_2$Cl$_2$, dried with anhydrous MgSO$_4$, and concentrated under reduced pressure. The resulting material was refined by column chromatography to obtain 1.7 g of Compound 2 (Yield: 93%).

Synthesis Example 3

Synthesis of Polymer 1

Compound 3 was synthesized according to Reaction Scheme 3 below:

Reaction Scheme 3
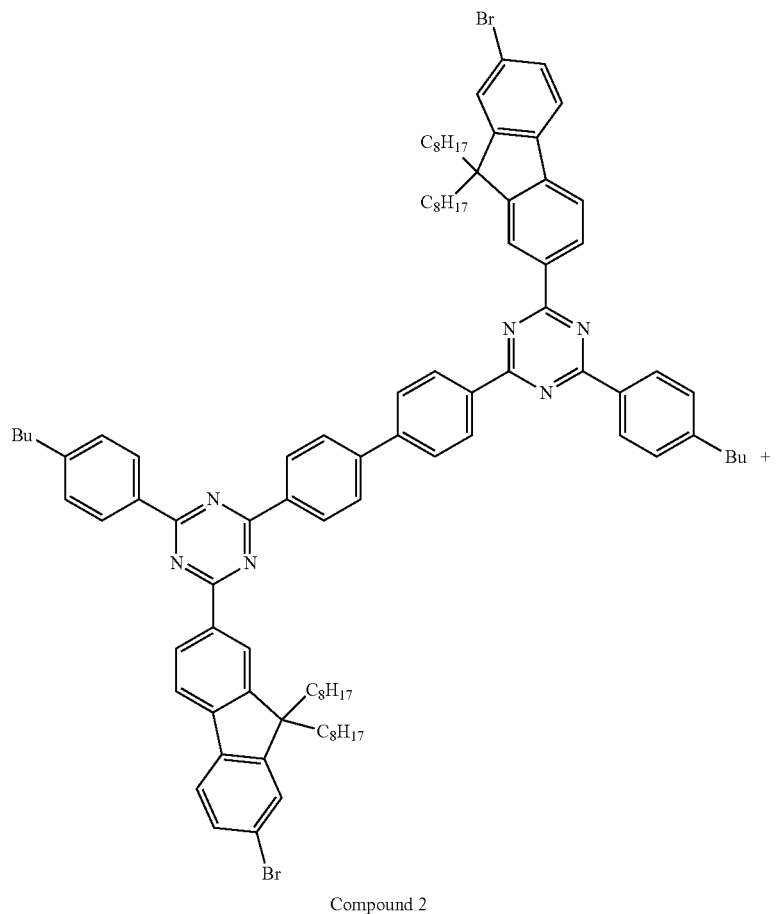
Compound 2
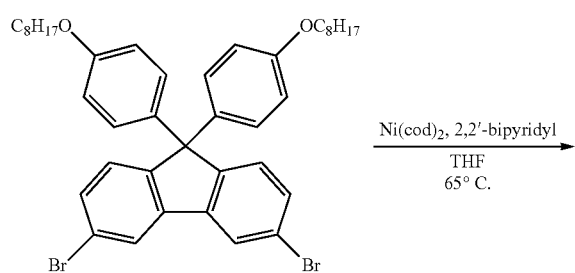
$\xrightarrow{\text{Ni(cod)}_2,\ 2,2'\text{-bipyridyl}}_{\substack{\text{THF}\\65°\ \text{C.}}}$

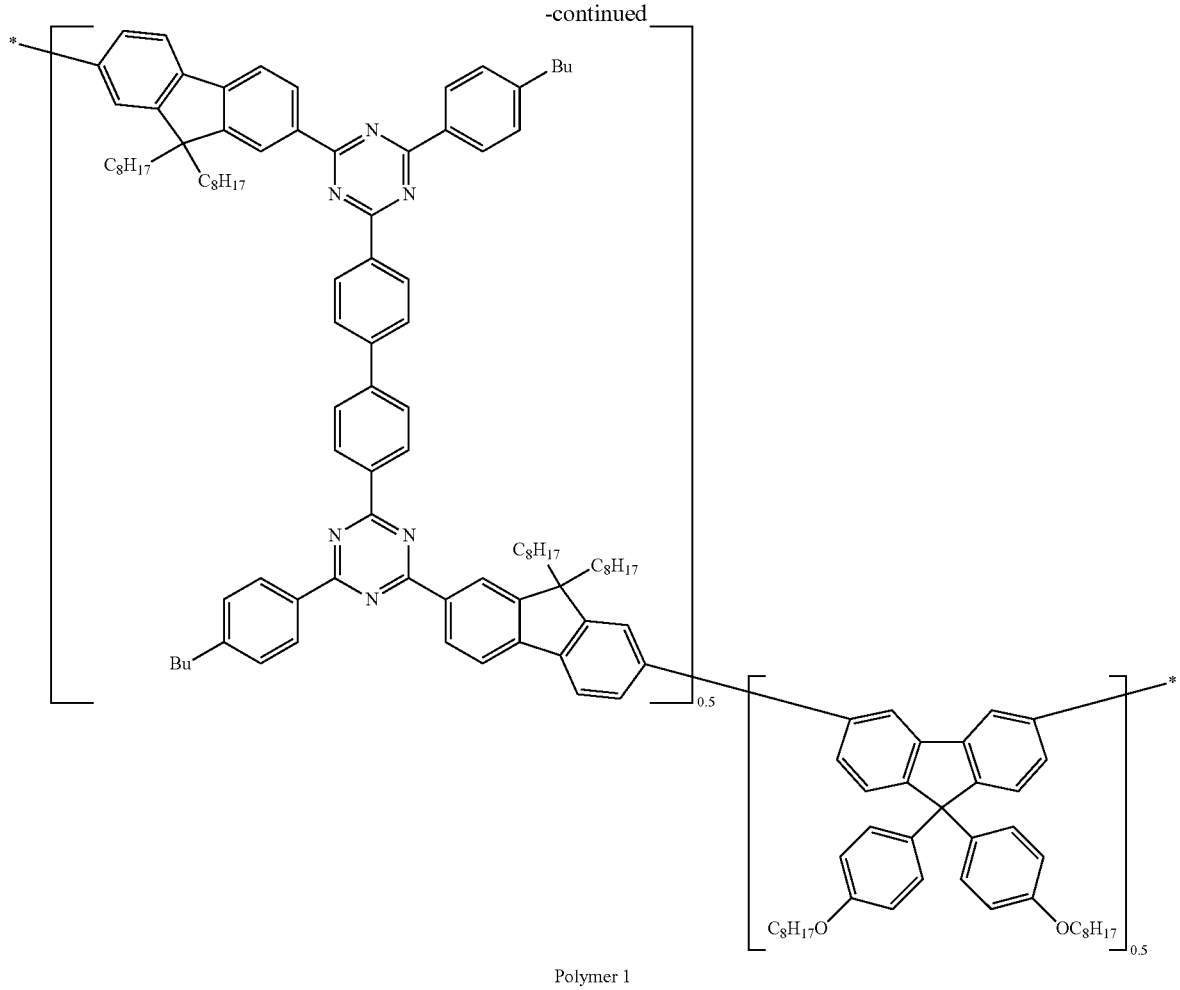

Polymer 1

910 mg (3.308 mmol) of bis(1,5-cyclooctadiene)nickel (Ni(cod)$_2$), 517 mg (3.308 mmole) of 2,2'-bipyridyl, 1 g (0.6615 mmole) of Compound 2, 485 mg (0.6615 mmole) of 3,6-dibromo-9,9-bis(4-(octyloxy)phenyl)-9H-fluorene, and 30 mL of anhydrous THF were loaded into a reactor and then the reactor was purged with nitrogen. Polymerization was performed at a temperature of 60° C. for 24 hours, then bromobenzene as an end capping agent was added to the reactor, and then the polymerization continued for an additional 24 hours. The reaction product was purified with Florisil, precipitated with acetone and methanol, and then dried in a vacuum for 24 hours.

Gel permeation chromatography ("GPC"): weight average molecular weight (Mw)=3.6×10$^5$ Daltons, number average molecular weight (Mn)=1.2×10$^5$ Daltons, polydispersity index ("PDI")=3.0.

Example 1

A transparent electrode substrate manufactured by coating a glass substrate with indium-tin oxide ("ITO") having a thickness of 150 nm was cleaned, then the ITO layer was patterned to obtain a desired shape using a photosensitive resin and an etchant, and then cleaned again. A hole transport layer forming composition that included PEDOT (Batron P 4083 manufactured by Bayer company) was spin coated on the ITO layer, and then baked at a temperature of 200° C. for about 0.5 hours, thereby forming a hole transport layer. An emitting layer forming composition that included polymer 1 and Ir(mppy)$_3$(10 wt %) in chlorobenzene was spin coated on the hole transport layer, and then baked at a temperature of 180° C. for 30 minutes, thereby forming an emitting layer including polymer 1 and Ir(mppy)$_3$. Each of the hole transport layer forming composition and the emitting layer forming composition was filtered with a 0.2 mm filter before spin coating. Thicknesses of the hole transport layer and the emitting layer were respectively selected to be 50 nm and 25 nm by controlling a concentration of the corresponding composition and a spin coating rate. TPBi was vacuum deposited on the emitting layer while a vacuum pressure was maintained at 4×10$^{-6}$ torr or less to form an electron transport layer having a thickness of 40 nm, and then, LiF and Al were sequentially deposited on the electron transport layer to form an electron injection layer having a thickness of 1 nm and a second electrode having a thickness of 100 nm, thereby completing manufacture of an organic light-emitting device. During the deposition, a layer thickness and a layer growth rate were controlled using a crystal sensor.

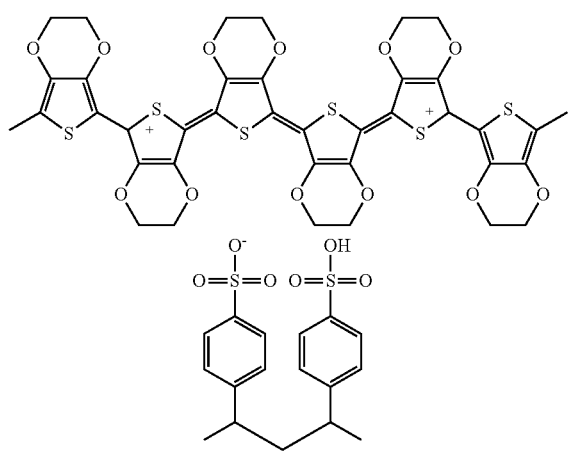

PEDOT:PSS

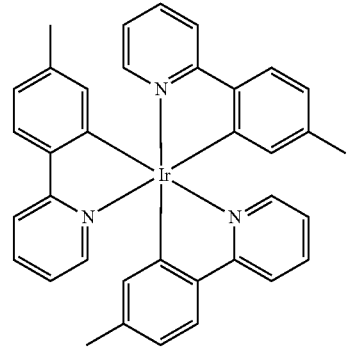

Compound 15:Ir(mppy)$_3$

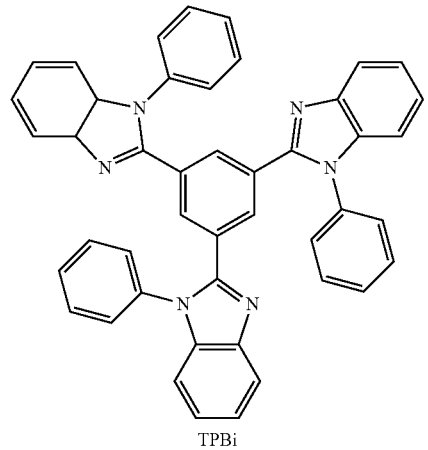

TPBi

Evaluation Example 1

Evaluation of Characteristics of Organic Light-Emitting Device

Figure 2:
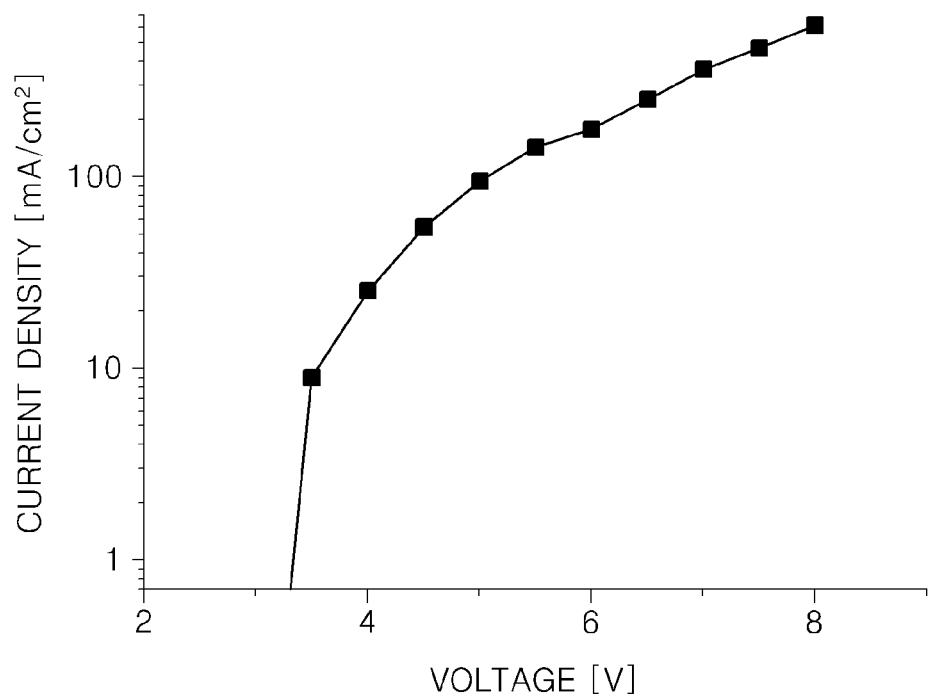
FIG. 2 is a graph of current density (milliamperes per square centimeter, $mA/cm^2$) versus voltage (volts, V) and is a voltage-current density graph of organic light-emitting devices manufactured according to Example 1.
Figure 3:
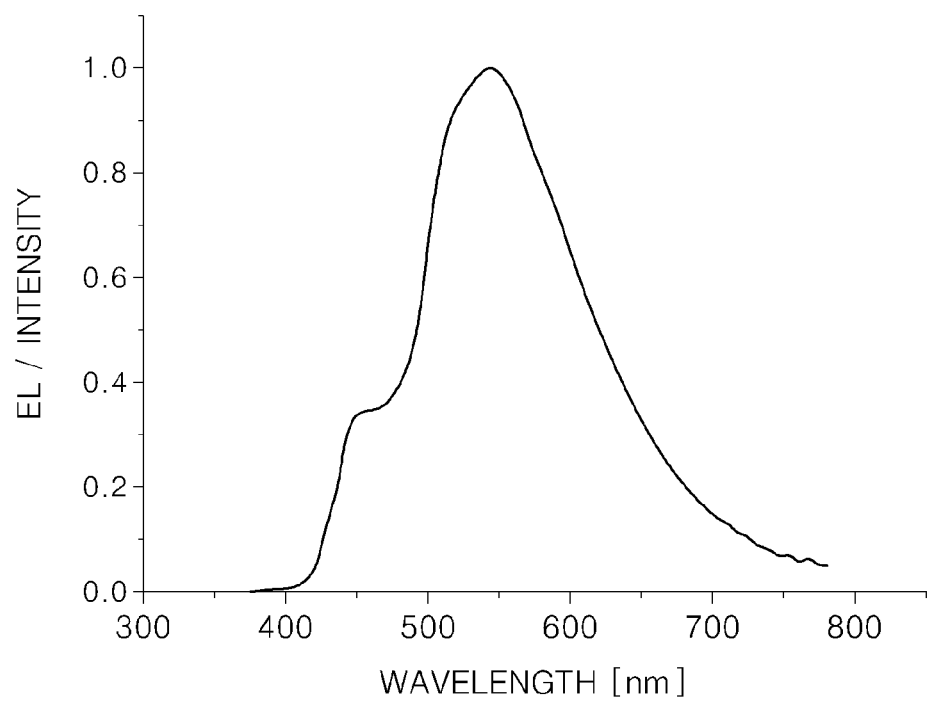
FIG. 3 is a graph of electroluminescent intensity (arbitrary units) versus wavelength (nanometers, m) which shows an electroluminescence ("EL") spectrum of an organic light-emitting device manufactured according to Example 1.
Figure 4:
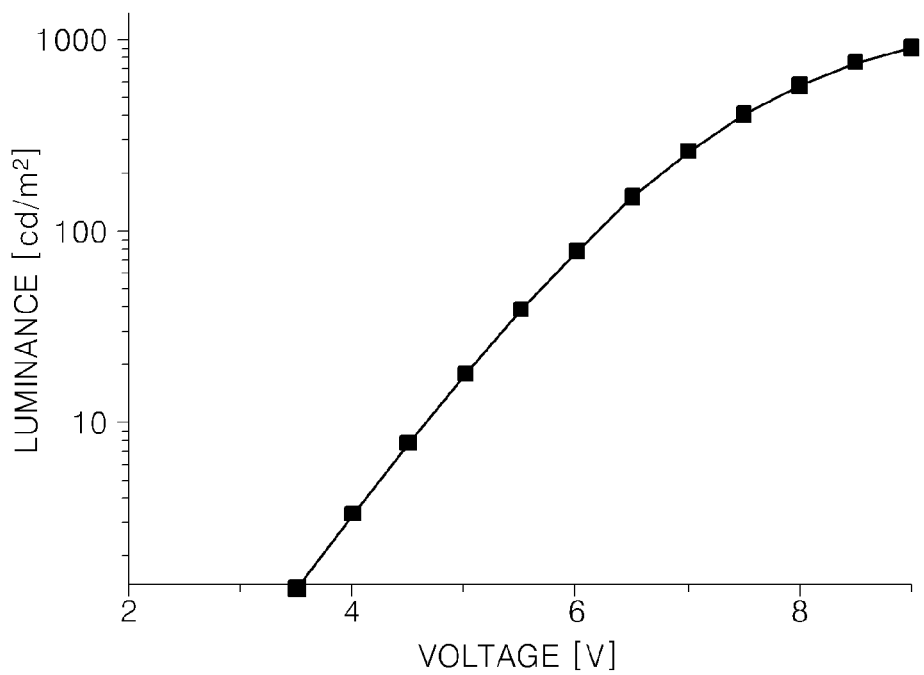
FIG. 4 is a graph of luminance ($cd/m^2$) versus voltage (V) of an organic light-emitting device manufactured according to Example 1.

Current density, electroluminescent ("EL") spectrum and luminance of the organic light-emitting device manufactured according to Example 1 was evaluated using a PR650 Spectroscan Source Measurement Unit (Photo Research), and the results are shown in FIGS. 2, 3 and 4.

Referring to FIGS. 2, 3 and 4, it was confirmed that the organic light-emitting device including Polymer 1 and manufactured according to Example 1 had good current density and EL spectrum characteristics.

It shall be understood that the exemplary embodiments disclosed herein should be considered in a descriptive sense only and not for purposes of limitation. Descriptions of features or aspects of each embodiment should be considered as available for other similar features or aspects in other embodiments.

What is claimed is:

1. A polymer comprising a first repeating unit represented by Formula 1A and the second repeating unit represented by Formula 3A-2 below:

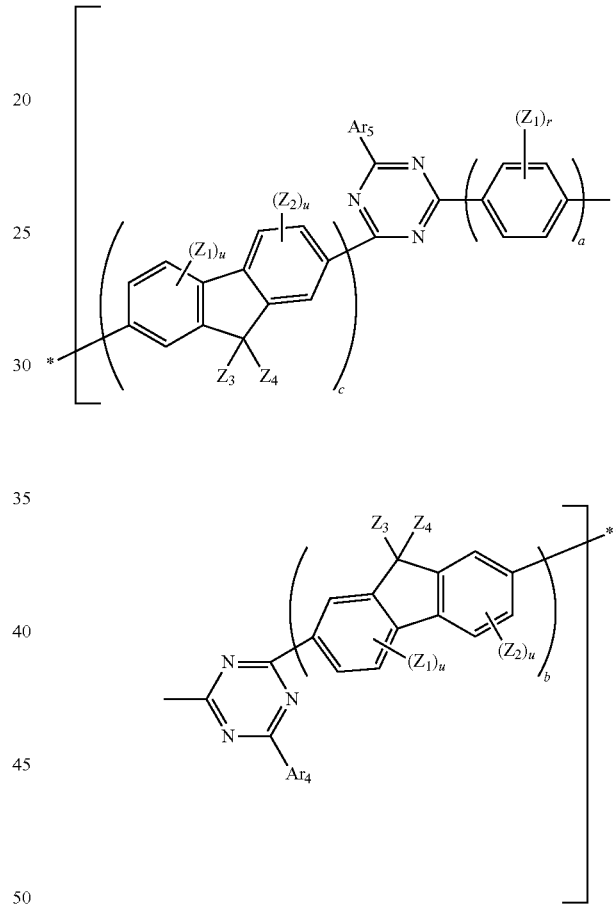

Formula 1A

Formula 3A-2 wherein in Formula 1A and 3A-2, a is 0, 1, 2, 3, or 4;

b and c are each independently 1 or 2;

$Z_1$ to $Z_4$ are each independently a hydrogen, a deuterium, a halogen, a hydroxyl group, a cyano group, a substituted or unsubstituted $C_1$-$C_{10}$ alkyl group, a substituted or unsubstituted $C_1$-$C_{10}$ alkoxy group, a substituted or unsubstituted $C_6$-$C_{20}$ aryl group, or a substituted or unsubstituted $C_2$-$C_{20}$ heteroaryl group;

r is an integer of 1 to 4;

u is an integer of 1 to 3; and $Ar_4$ and $A_5$ are each independently a phenyl group, a ($C_1$-$C_{10}$ alkyl)phenyl group, a di($C_1$-$C_{10}$ alkyl)phenyl group, a ($C_6$-$C_{14}$ aryl)phenyl group, a di($C_6$-$C_{14}$ aryl)phenyl group, a naphthyl group, a ($C_1$-$C_{10}$ alkyl)naphthyl group, a di($C_1$-$C_{10}$ alkyl)naphthyl group, a ($C_6$-$C_{14}$ aryl)naphthyl group, a di($C_6$-$C_{14}$ aryl)naphthyl group, an anthryl group, a ($C_1$-$C_{10}$ alkyl)anthryl group, a di($C_1$-$C_{10}$ alkyl)anthryl group, a ($C_6$-$C_{14}$ aryl)anthryl group, a di($C_6$-$C_{14}$ aryl)anthryl group, a fluorenyl group, a ($C_1$-$C_{10}$ alkyl)fluorenyl group, a di($C_1$-$C_{10}$ alkyl)fluorenyl group, a ($C_6$-$C_{14}$ aryl)fluorenyl group, a di($C_6$-$C_{14}$ aryl) fluorenyl group, a phenanthryl group, a ($C_1$-$C_{10}$ alkyl) phenanthryl group, a di($C_1$-$C_{10}$ alkyl)phenanthryl group, a ($C_6$-$C_{14}$ aryl) phenanthryl group, or a di($C_6$-$C_{14}$ aryl)phenanthryl group;

$R_{11}$ to $R_{16}$ are each independently hydrogen, deuterium, a halogen, a hydroxyl group, a cyano group, a nitro group, a carboxyl group, a $C_1$-$C_{10}$ alkyl group, a $C_2$-$C_{10}$ alkenyl group, a $C_1$-$C_{10}$ alkoxy group, phenyl group, a ($C_1$-$C_{10}$ alkyl)phenyl group, a di($C_1$-$C_{10}$ alkyl)phenyl group, a ($C_1$-$C_{10}$ alkoxy)phenyl group, or a di($C_1$-$C_{10}$ alkoxy) phenyl group;

$Q_6$ and $Q_7$ are each independently a phenyl group, a ($C_1$-$C_{10}$ alkyl)phenyl group, a di($C_1$-$C_{10}$ alkyl)phenyl group, a ($C_1$-$C_{10}$ alkoxy)phenyl group, or a di($C_1$-$C_{10}$ alkoxy) phenyl group; and

* and *' are each independently a binding site with the neighboring repeating unit.

2. The polymer of claim 1, wherein the second repeating unit is represented by Formula 4A below:

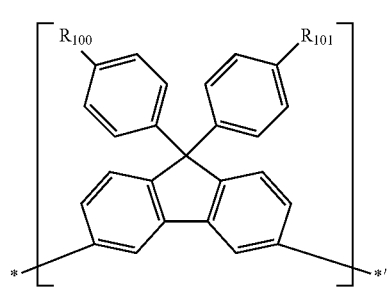

Formula 4A wherein in Formula 4A, $R_{100}$, and $R_{101}$ are each independently a $C_1$-$C_{10}$ alkyl group or a $C_1$-$C_{10}$ alkoxy group and * and *' are each independently a binding site with the neighboring repeating unit.

3. The polymer of claim 1, wherein a weight average molecular weight of the polymer is about 2,000 to about 1,000,000.

4. The polymer of claim 1, wherein the polymer has electron transporting characteristics and functions as a phosphorescent host.

5. An organic light-emitting device comprising:
a substrate;
a first electrode on the substrate;
a second electrode on the first electrode; and
a first layer which is disposed between the first electrode and the second electrode and comprises the polymer of claim 1.

6. The organic light-emitting device of claim 5, wherein the first layer is an emitting layer and further comprises a phosphorescent dopant.

7. The organic light-emitting device of claim 6, wherein the phosphorescent dopant is an organometallic complex comprising iridium, platinum, osmium, rhenium, titanium, zirconium, hafnium, or a combination thereof.

8. The organic light-emitting device of claim 6, wherein an amount of the phosphorescent dopant in the first layer is about 1 to about 10 weight percent.

9. The organic light-emitting device of claim 5, wherein a hole injection layer, a hole transport layer, an emitting layer, a hole blocking layer, an electron transport layer, an electron injection layer, or any combination thereof is further disposed between the first electrode and the second electrode.

* * * * *